(12) United States Patent
Song et al.

(10) Patent No.: US 8,384,117 B2
(45) Date of Patent: Feb. 26, 2013

(54) LIGHT EMITTING DEVICE PACKAGE AND LIGHTING SYSTEM INCLUDING THE SAME

(75) Inventors: Yong Seon Song, Yongin-si (KR); Kyoung Woo Jo, Gunpo-si (KR)

(73) Assignee: LG Innotek Co., Ltd., Seoul (KR)

( * ) Notice: Subject to any disclaimer, the term of this patent is extended or adjusted under 35 U.S.C. 154(b) by 4 days.

(21) Appl. No.: 12/707,325

(22) Filed: Feb. 17, 2010

(65) Prior Publication Data

US 2010/0207154 A1  Aug. 19, 2010

(30) Foreign Application Priority Data

Feb. 18, 2009  (KR) .................. 10-2009-0013575

(51) Int. Cl.
*H01L 33/00* (2010.01)
*H01L 23/10* (2006.01)
*H01L 23/04* (2006.01)

(52) U.S. Cl. .......... 257/99; 257/706; 257/712; 257/717; 257/E33.058; 257/E33.066; 257/E33.075

(58) Field of Classification Search .................. None
See application file for complete search history.

(56) References Cited

U.S. PATENT DOCUMENTS

| | | | | |
|---|---|---|---|---|
| 5,506,755 A * | 4/1996 | Miyagi et al. | ................. | 361/720 |
| 6,531,328 B1 * | 3/2003 | Chen | ................. | 438/26 |
| 6,874,910 B2 * | 4/2005 | Sugimoto et al. | ............. | 362/294 |
| 7,218,041 B2 * | 5/2007 | Isoda | ................. | 313/11 |
| 7,710,016 B2 * | 5/2010 | Miki et al. | .................... | 313/502 |
| 2003/0012925 A1 * | 1/2003 | Gorrell | .................... | 428/137 |
| 2003/0189830 A1 * | 10/2003 | Sugimoto et al. | ............. | 362/294 |
| 2004/0188696 A1 * | 9/2004 | Hsing Chen et al. | ........... | 257/99 |
| 2006/0214178 A1 | 9/2006 | Choi et al. | | |
| 2006/0220036 A1 * | 10/2006 | Lee et al. | ................. | 257/81 |
| 2006/0278885 A1 | 12/2006 | Tain et al. | | |
| 2007/0057364 A1 * | 3/2007 | Wang et al. | .................. | 257/701 |
| 2007/0085101 A1 * | 4/2007 | Kim | ................. | 257/98 |
| 2007/0090510 A1 | 4/2007 | Tseng et al. | | |
| 2007/0096129 A1 * | 5/2007 | Park | ................. | 257/98 |
| 2007/0187706 A1 * | 8/2007 | Higashi et al. | .................. | 257/98 |
| 2007/0228386 A1 | 10/2007 | Shie et al. | | |
| 2007/0235739 A1 * | 10/2007 | Sun et al. | ................. | 257/79 |
| 2008/0043444 A1 * | 2/2008 | Hasegawa et al. | ........... | 361/717 |
| 2008/0054285 A1 * | 3/2008 | Park | ................. | 257/98 |
| 2008/0099770 A1 * | 5/2008 | Mendendorp et al. | .......... | 257/79 |
| 2009/0008666 A1 * | 1/2009 | Otsuka et al. | .................. | 257/98 |
| 2009/0014735 A1 | 1/2009 | Higashi et al. | | |
| 2009/0039379 A1 | 2/2009 | Shiraishi et al. | | |
| 2009/0121249 A1 * | 5/2009 | Tseng et al. | .................... | 257/98 |
| 2009/0273002 A1 * | 11/2009 | Chiou et al. | ................... | 257/99 |
| 2009/0315057 A1 * | 12/2009 | Konishi et al. | ................. | 257/98 |
| 2010/0117113 A1 * | 5/2010 | Lu et al. | ........................... | 257/99 |
| 2010/0181582 A1 * | 7/2010 | Li et al. | ........................... | 257/91 |

FOREIGN PATENT DOCUMENTS

| | | |
|---|---|---|
| EP | 1848044 A2 | 10/2007 |
| EP | 2023699 A2 | 2/2009 |
| KR | 10-1999-027225 A | 4/1999 |
| KR | 10-0610650 B1 | 8/2006 |
| WO | WO-2007/049938 A1 | 5/2007 |

* cited by examiner

*Primary Examiner* — Hoang-Quan Ho

(74) *Attorney, Agent, or Firm* — Birch, Stewart, Kolasch & Birch, LLP

(57) ABSTRACT

Provided are a light emitting device package and a lighting system comprising the same. The light emitting device package comprises a package body having a trench, a metal layer within the trench, and a light emitting device over the metal layer.

11 Claims, 8 Drawing Sheets

LIGHT EMITTING DEVICE PACKAGE AND LIGHTING SYSTEM INCLUDING THE SAME

CROSS-REFERENCE TO RELATED APPLICATIONS

The present application claims priority under 35 U.S.C. §119 to Korean Patent Application No. 10-2009-0013575 (filed on Feb. 18, 2009), which is hereby incorporated by reference in its entirety.

BACKGROUND

Embodiments relate to a light emitting device package and a lighting system including the same.

A light emitting diode (LED) may constitute a light emitting source using compound semiconductor materials such as GaAs-based materials, AlGaAs-based materials, GaN-based materials, InGaN-based materials and InGaAlP-based materials.

Light emitting devices are being variously applied in the fields of optical devices and high-power electronic devices.

Such a light emitting device is packaged, and thus is being used as a light emitting apparatus that emits light having various colors. The light emitting apparatus is being used as a light source in various fields, e.g., lighting displays, character displays, and image displays.

SUMMARY

Embodiments provide a light emitting device package and a lighting system including the same that enhance thermal emission efficiency.

In one embodiment, a light emitting device package comprises: a package body having a trench; a metal layer within the trench; and a light emitting device over the metal layer.

In another embodiment, a lighting system comprises: a light emitting module comprising a light emitting device package including a package body having a trench; a metal layer within the trench; and a light emitting device over the metal layer.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device package according to an embodiment and a lighting system including the same will be described with reference to accompanying drawings.

In the following description, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
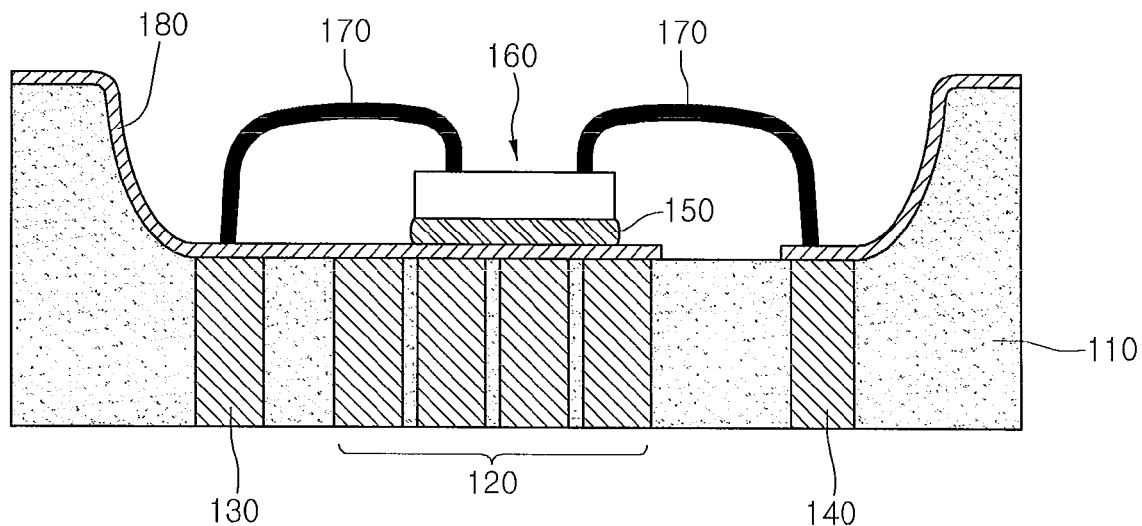
FIG. 1 is a sectional view of a light emitting device package according to an embodiment.

FIG. 1 is a sectional view of a light emitting device package according to an embodiment.

A light emitting device package according to an embodiment may include a package body 110 having a trench, a metal layer 120 disposed in the trench, an adhesion layer 150 disposed on the metal layer 120, and a light emitting device 160 disposed on the adhesion layer 150.

In an embodiment, the light emitting device may be a light emitting diode (LED), but is not limited thereto.

Although a horizontal-type light emitting device chip is illustrated in FIG. 1, the present disclosure is not limited thereto. For example, the embodiments may be applicable to a vertical-type light emitting device chip.

In an embodiment, the light emitting device package may have a structure in which an anisotropic wet or dry etching process is performed on the package body 110 to define a via hole, and then an electroplating process is performed to fill the via hole.

At this time, current may be supplied through the via hole defined at edges of a bottom surface of the light emitting device to emit heat through the via hole defined below the light emitting device chip, thereby improving thermal emission efficiency.

In the light emitting device according to an embodiment, the percentage of a metal having high heat conductivity may increase, and a narrow and deep thermal diffusion layer may be disposed in a bottom surface of the light emitting device package to improve the thermal emission efficiency.

Also, since an anisotropic wet etching process considering a crystal orientation of a substrate is performed to define a narrow and deep trench at a low cost, a narrow and deep thermal diffusion layer may be formed when a metal having high heat conductivity is filled using an electroplating technology.

Hereinafter, a method of packaging a light emitting device will be described with reference to FIGS. 2 to 5.

Figure 2:
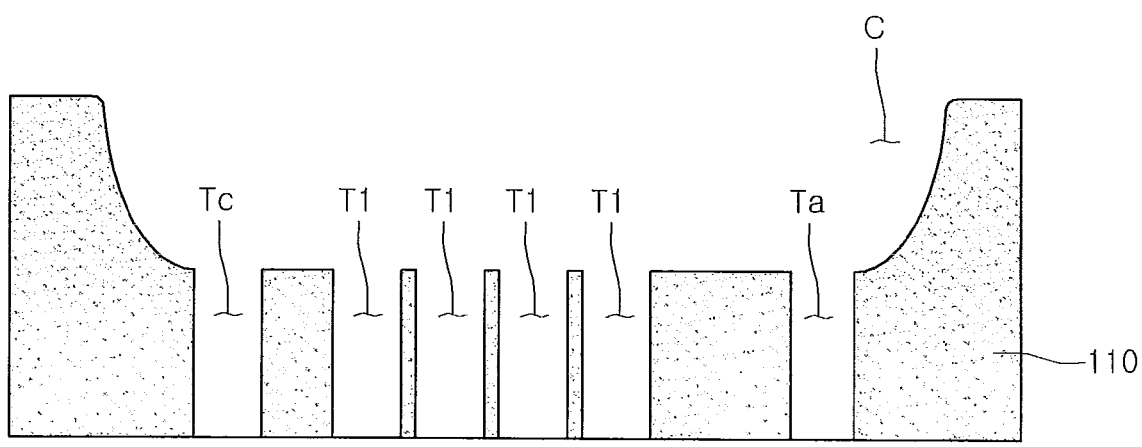
FIGS. 2 to 5, including

As shown in FIG. 2, a cavity C for mounting a light emitting device 160 may be formed in a package body 110, but is not limited thereto.

The package body 110 may be a silicon (Si) substrate, but is not limited thereto. The package body 110 may have a <110> orientation.

In a related art, a <100> Si wafer used for forming a thermal emission via has a <111> crystal plane and an inclined angle of about 54.7°. Thus, when a wet etching process is performed, the thermal emission via has a shape whose width gradually narrows or expands toward a downward direction. Thereafter, there is a limitation that it is difficult to form a narrow and deep trench.

Also, an anisotropic dry etching process such as a reactive ion etching (RIE) process except the wet etching process may be performed to form a plurality of narrow and deep trenches. However, considering an expensive manufacturing cost and processing time, it is difficult to apply the anisotropic dry etching process to a process of manufacturing an LED package.

Thus, in an embodiment, a <110> Si wafer in which a <111> crystal plane is perpendicular thereto may be used to form a narrow and deep trench using the anisotropic wet etching process that is an inexpensive etching process.

Thereafter, as shown in FIG. 2, a plurality of first trenches T1 may be formed in the package body 110 having the cavity C. Each of the first trenches T1 may have a vertical width greater than a horizontal width thereof with respect to a vertical section of the respective first trenches T1.

The plurality of first trenches T1 may be configured to form a metal layer 120 for emitting heat. At this time, a cathode lead trench Tc and an anode lead trench Ta may be formed together with the plurality of first trenches T1.

Figure 3:
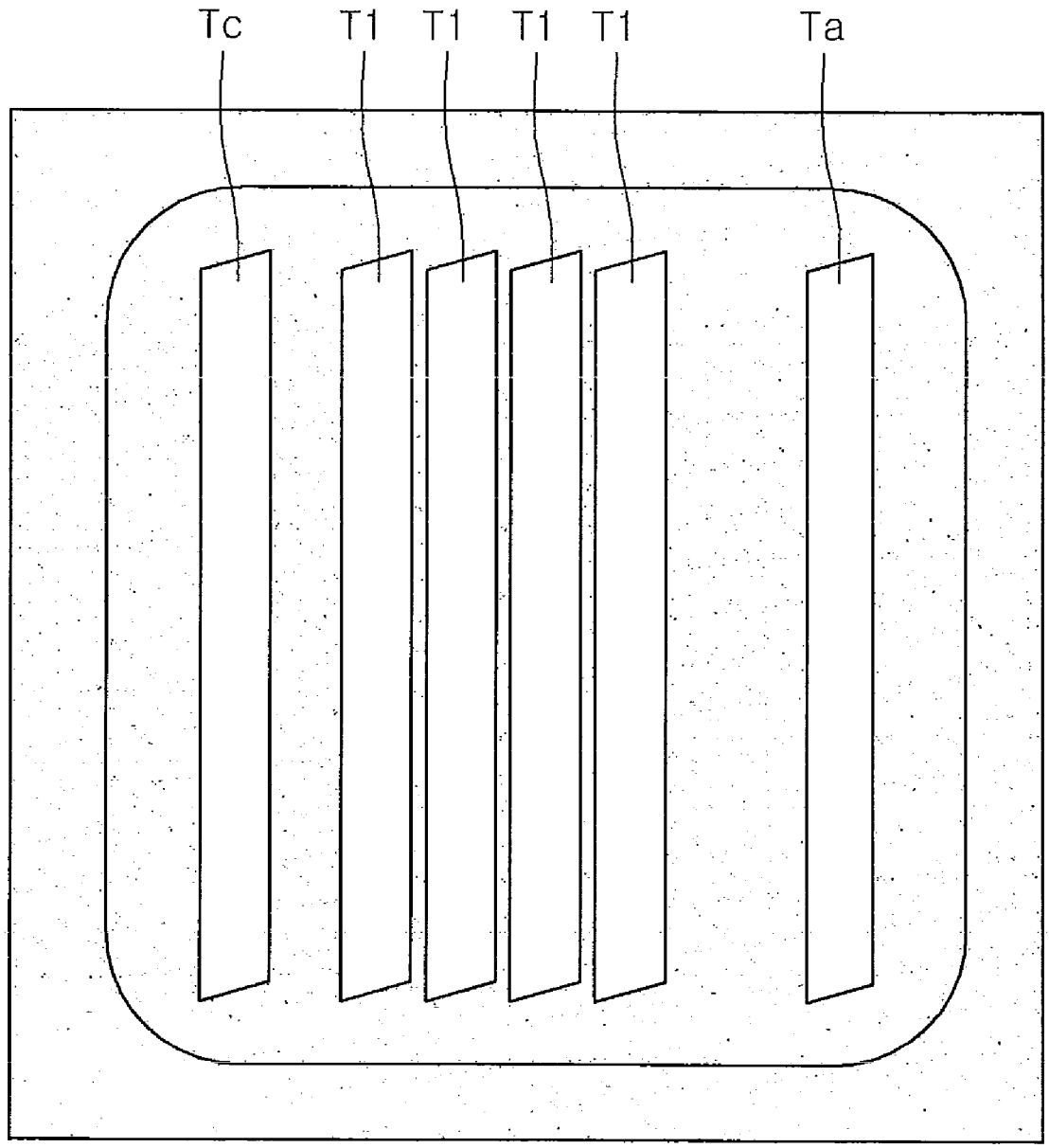

FIG. 3 is a plan view of a case in which an anisotropic wet etching process is performed on a <110> Si wafer.

A solution in which KOH may be mixed with water and isopropyl alcohol may be used as an anisotropic etching solution used for forming the trenches, but is not limited thereto. For example, the etching process may be performed using about 23% by wt. of KOH, about 13% by wt. of isopropyl alcohol, and about 63% by wt. of water, but is not limited thereto.

According to an embodiment, an etch mask (not shown) disposed in a direction parallel to that of a (111) plane is patterned on a package body 110, e.g., a bottom surface of a <110> Si substrate package to form a narrow and deep first trench T1 defined in a vertical direction using a wet etching process.

According to an embodiment, a plurality of narrow and deep first trenches T1 defined in a vertical direction may be formed using an anisotropic etching process in consideration of an etching property according to a crystal orientation of a package body 110.

In the light emitting device package according to an embodiment and the method of manufacturing the same, the percentage of the metal having high heat conductivity may increase, and the narrow and deep thermal diffusion layer may be disposed in the bottom surface of the light emitting device package to improve the thermal emission efficiency.

Figure 4:
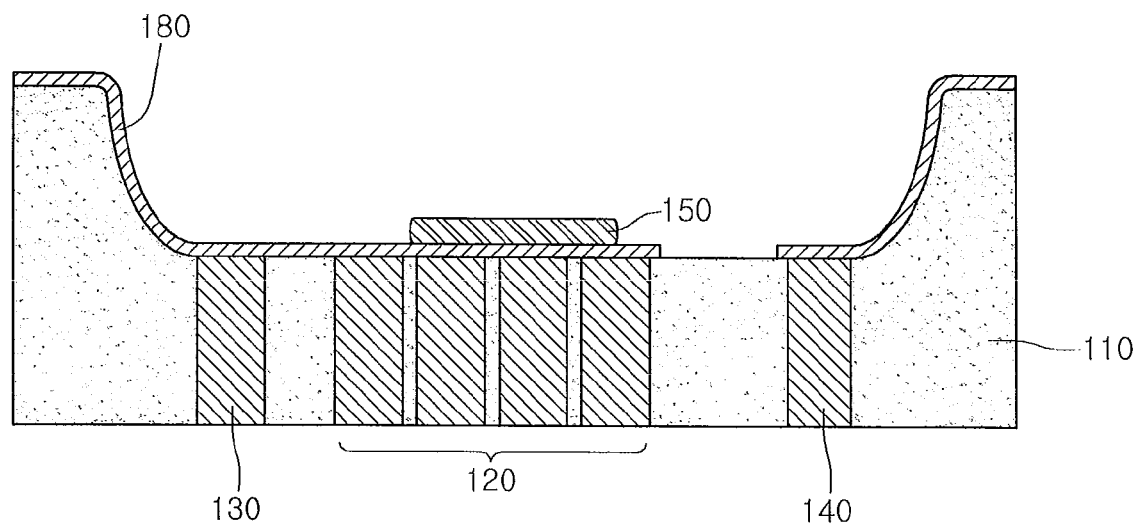

As shown in FIG. 4, a plurality of metal layers 120 is formed in the plurality of first trenches T1. For example, the metal layers 120 may be deposited within the plurality of first trenches T1 using an electroplating technology to fill the trenches.

Each of the metal layers 120 may have a rectangular bar-shape in a vertical section. At this time, a cathode lead trench Tc and an anode lead trench Ta together with the metal layers 120 may be filled to form a cathode lead 130 and an anode lead 140.

Since an anisotropic wet etching process considering a crystal orientation of a substrate is performed to define a narrow and deep trench at a low cost, a narrow and deep thermal diffusion layer may be formed when a metal having high heat conductivity is filled using an electroplating technology.

A reflection layer 180 may be formed on the package body 110, but is not limited thereto. The reflection layer 180 may be a conductive reflection layer 180. For example, the reflection layer 180 may include a metal layer containing Al, Ag, or an alloy containing Al or Ag. The reflection layer 180 may be configured to electrically separate the cathode lead 130 from the anode lead 140.

Thereafter, an adhesion layer 150 may be formed on the reflection layer 180.

For example, the light emitting device 160 may be attached to the package body 110 using a polymer adhesive or a plated eutectic metal.

Also, the light emitting device 160 may be attached to the package body 110 through a soldering process using Ag conductive epoxy having improved process or a eutectic bonding process in case where highly thermal conductivity is required, but is not limited thereto.

Figure 5:
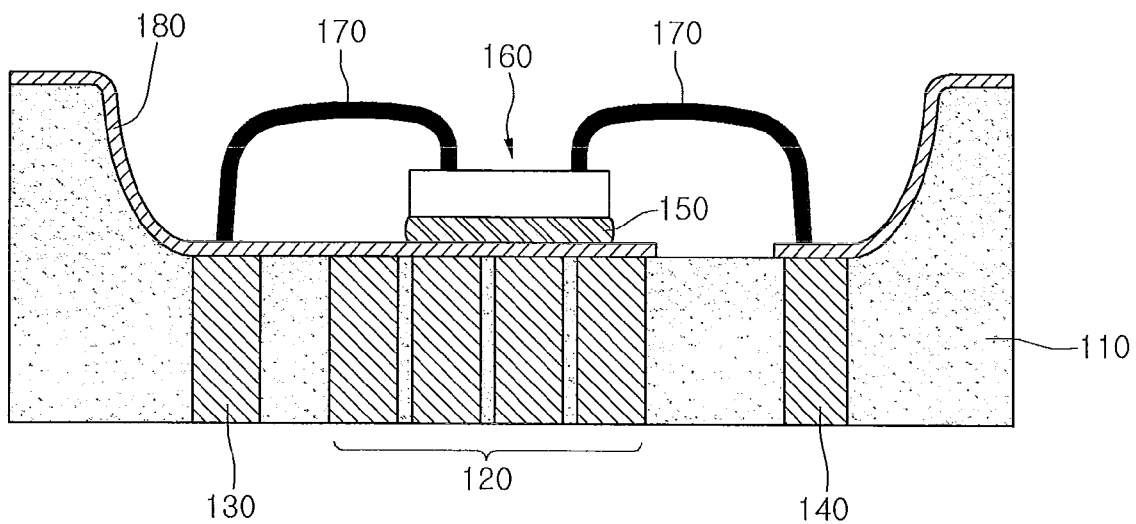
Figure 5A:
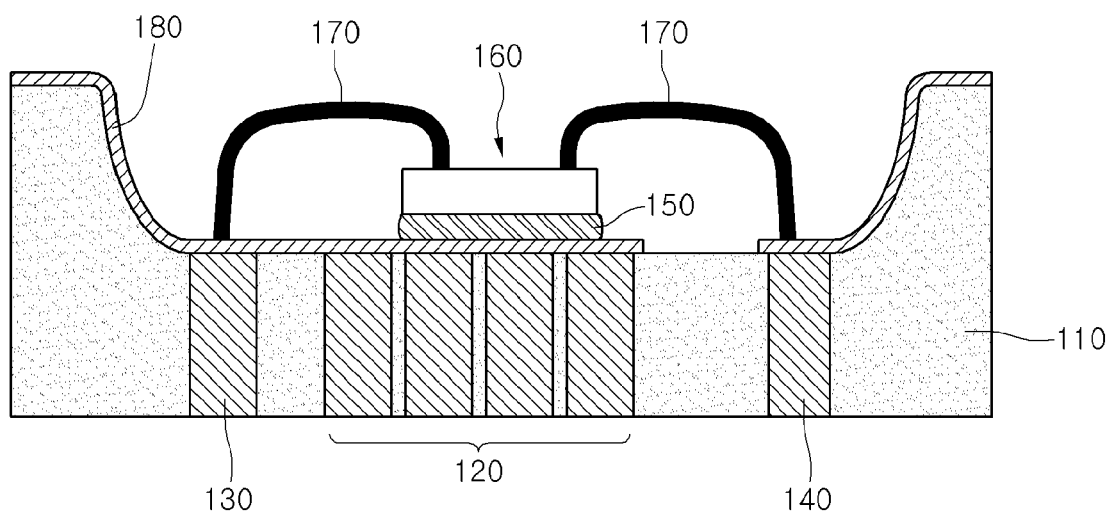
FIGS. 5A-5B, are views illustrating a process of manufacturing a light emitting device package according to an embodiment.
Figure 5B:
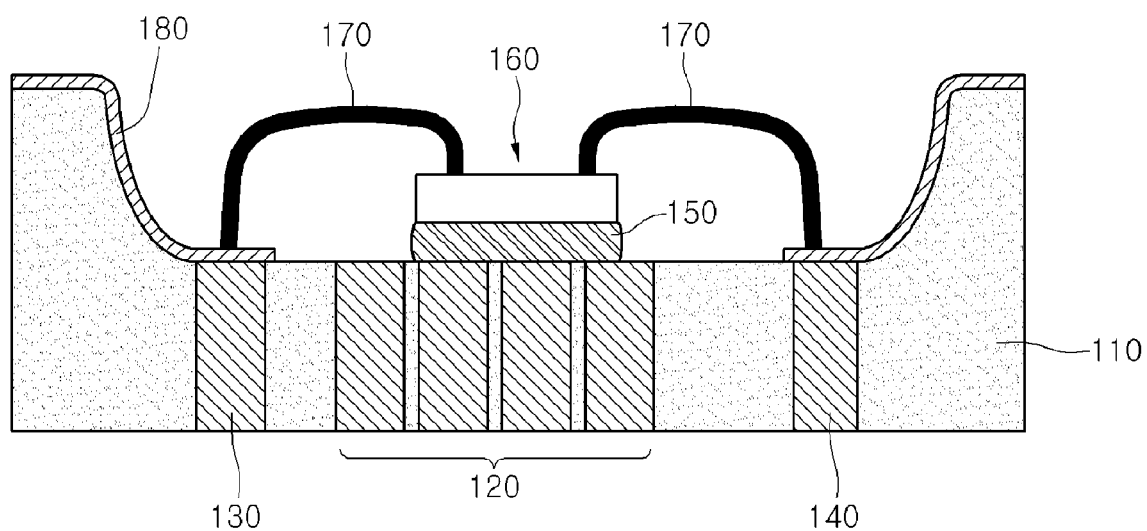

As shown in FIGS. 5A-5B, a wire bonding process is performed on the light emitting device 160.

For example, the cathode lead 130 may be connected to a cathode electrode (not shown) of the light emitting device 160, and the anode lead 140 may be connected to an anode electrode of the light emitting device 160.

For example, the wire 170 may include one or more wires of a gold wire, a copper wire, and an aluminium wire. The wire bonding process may include ball wire bonding or edge wire bonding.

In FIG. 5A, when the light emitting device 160 is a vertical-type light emitting device 160, the light emitting device is electrically connected to the metal layer 120. However, as shown in FIG. 5B, the light emitting device 160 may not be electrically connected to the metal layer 120. That is, the light emitting device 160 may be electrically separated from the metal layer 120, thus forming a horizontal-type light emitting device.

When the light emitting device 160 is the vertical-type light emitting device 160, the adhesion layer 150 may have conductivity, and only one wire may be used.

Also, when the light emitting device 160 is the vertical-type light emitting device 160, the metal layer 120 may serve as an electrode layer. Also, the metal layer 120 may be electrically connected to the light emitting device 160. In this case, a separate cathode lead and anode lead may not be formed.

When the light emitting device 160 is bonded using a flip chip bonding technique, the wire is not required. Also, electrodes of the light emitting device 160 may be electrically connected to the cathode lead 130 and the anode lead 140.

Figure 6:
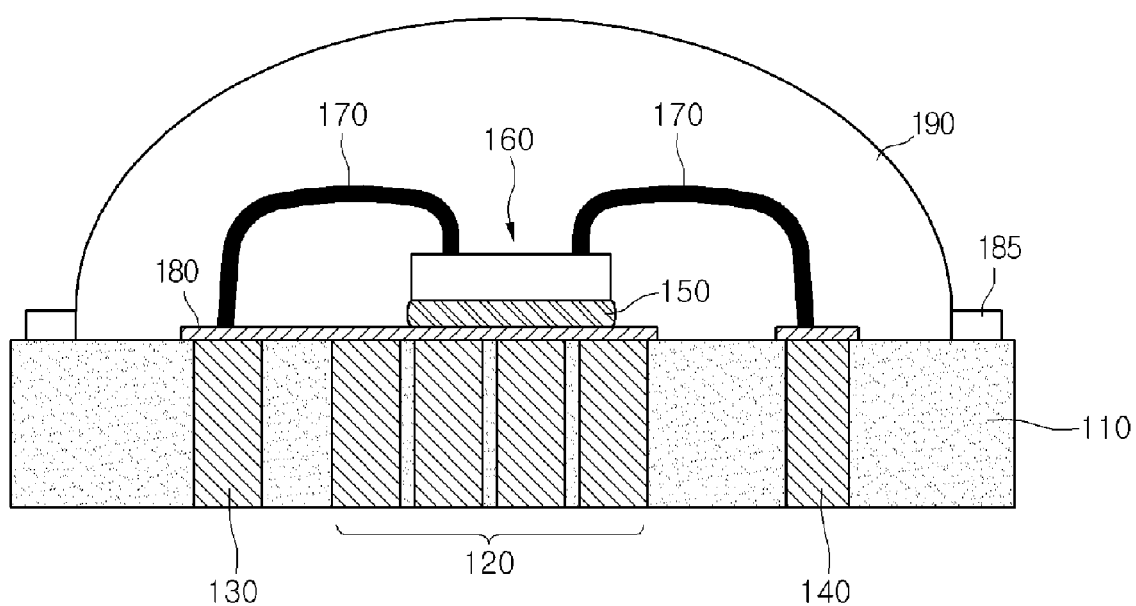
FIG. 6 is a sectional view of a light emitting device package according to another embodiment.

FIG. 6 is a sectional view of a light emitting device package according to another embodiment.

A light emitting device package of FIG. 6 according to another embodiment may adopt technical properties of the light emitting device according to an embodiment.

The light emitting device package according to another embodiment may include barriers 185 disposed on a package body 110 of both sides of a light emitting device 160 and a sealant 190 disposed on the light emitting device 160.

In an embodiment, at least one barrier 185 may be formed when the sealant 190 is formed. The barrier 185 may help the formation of the sealant 190 as well as prevent a lifting phenomenon of the sealant 190. The barrier 185 may include an oxide layer or a nitride layer, but is not limited thereto.

The sealant 190 may include a phosphor (not shown). For example, a sealing method of the sealant 190 may include a dispensing method, a casting molding method, a transfer molding method, and a vacuum printing method.

Also, a blue light emitting device may use a yellow phosphor such as yttrium aluminum garnet (YAG) and terbium aluminum garnet (TAG) as a phosphor, or an UV light emitting device may use a (red/green/blue) three-colored phosphor as a phosphor, but is not limited thereto.

In the light emitting device package of FIG. 6 according to another embodiment, the sealant 190 may have a dome shape by the barriers 185 including a dielectric, but is not limited thereto.

According to the light emitting device package according to the embodiments and the method of manufacturing the same, in a wafer level packaging, the percentage of the metal having the high heat conductivity may increase, and the narrow and deep thermal diffusion layer may be disposed in the bottom surface of the light emitting device package to improve the thermal emission efficiency.

Also, since the anisotropic wet etching process considering the crystal orientation of the substrate is performed to define the narrow and deep trench at a low cost, the narrow and deep thermal diffusion layer may be formed when the metal having the high heat conductivity is filled using the electroplating technology.

The light emitting device package according to an embodiment may be applicable to a lighting system. The lighting system may include a lighting unit illustrated in FIG. 7, a backlight unit illustrated in FIG. 8, traffic lights, a vehicle headlight, and a sign.

Figure 7:
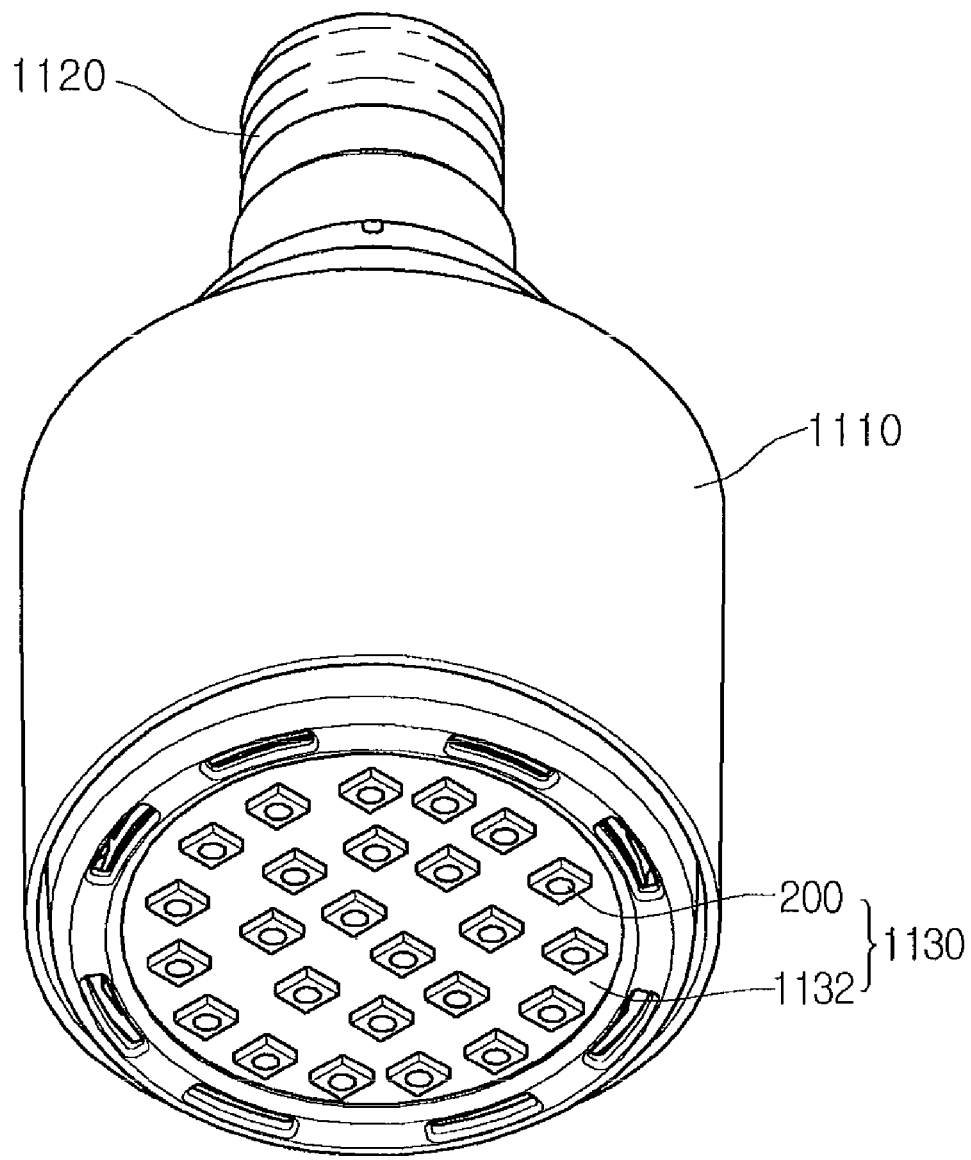
FIG. 7 is a perspective view of a lighting unit according to an embodiment.

FIG. 7 is a perspective view of a lighting unit according to an embodiment.

Referring to FIG. 7, a lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a substrate 1132 and at least one light emitting device package 1210 mounted on the substrate 1132.

A circuit pattern may be printed on an insulation material to form the substrate 1132. For example, the substrate 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

At least one light emitting device package 1210 may be mounted on the substrate 1132. The light emitting device package 1210 may include at least one light emitting diode (LED) 100. The LED 100 may include a colored LED that emits red, green, blue, or white light and an UV LED that emits ultraviolet (UV) light.

The light emitting module 1130 may include a plurality of light emitting device packages 1210 to obtain various colors and brightness. For example, a white LED, a red LED, and a green LED may be disposed in combination with each other to secure a high color rendering index (CRI).

The connection terminal 1120 may be electrically connected to the light emitting module 1130 to supply a power. As shown in FIG. 7, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power using an interconnection.

Figure 8:
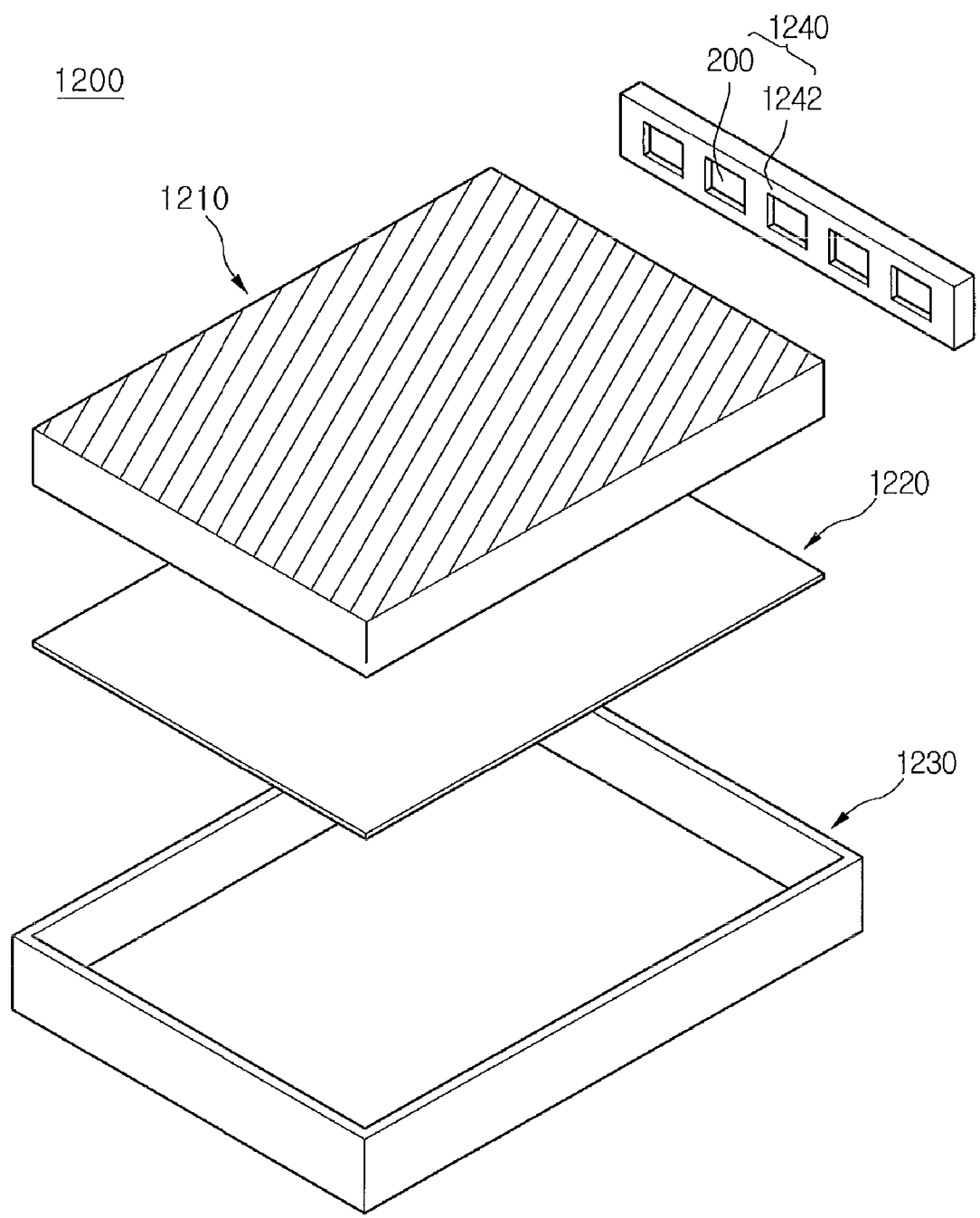
FIG. 8 is a perspective view of a backlight unit according to an embodiment.

FIG. 8 is a perspective view of a backlight unit according to an embodiment.

A backlight unit 1200 according to an embodiment may include a light guide plate 1210, a light emitting module 1240, a reflective member 1220, and a bottom cover 1230, but is not limited thereto. The light emitting module 1240 may contact at least one surface of the light guide plate 1210 to provide light the light guide plate 1210, but is not limited thereto. The reflective member 1220 may be disposed below the light guide plate 1210. The bottom cover 1230 may receive the light guide plate 1210, the light emitting module 1240, and the reflective member 1220.

The light guide plate 1210 may diffuse light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 may provide light to at least one surface of the light guide plate 1210. Thus, the light emitting module 1240 may be used as a light source of a display device including the backlight unit.

The light emitting module 1240 may contact the light guide plate 1210 but is not limited thereto.

In particular, the light emitting module 1240 may include a substrate 1242 and a plurality of light emitting device package 200 mounted on the substrate 1242. The substrate 1242 may contact the light guide plate 1210, but is not limited thereto.

The substrate 1242 may be a PCB including a circuit pattern (not shown). However, the substrate 1242 may include a metal core PCB or a flexible PCB as well as the PCB, but is not limited thereto.

The plurality light emitting device packages 200 may be mounted on the substrate 1242. Also, a light emitting surface of each of the light emitting device packages 200 may be spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member 1220 may be formed of one of PET, PC, and PVC, but is not limited thereto.

The bottom cover 1230 may store the light guide plate 1210, the light emitting module 1240, and the reflective member 1220. For this, the bottom cover 1230 may have a box shape with an opened upper side, but is not limited thereto.

The bottom cover 1230 may be formed of a metal material or a resin material. Also, the bottom cover 1230 may be manufactured using a press forming process or an extrusion molding process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
a package body having a trench;
a metal layer within the trench;
an adhesion layer over the metal layer;
a light emitting device over the adhesion layer;
a cathode lead in the package body on one side of the metal layer; and
an anode lead in the package body on another side of the metal layer,
wherein the adhesion layer is a non-electrically conductive layer,
wherein the metal layer is electrically separated from the light emitting device by the adhesion layer,
wherein the metal layer is electrically separated from the cathode lead and the anode lead,
wherein at least one region of the adhesion layer is directly on at least one top surface region of the metal layer,
wherein the metal layer, the cathode lead and the anode lead are formed of a same electrically conductive metal material, and
wherein the package body comprises a silicon substrate having a <110> orientation.

2. The light emitting device package according to claim 1, wherein the trench comprises a constant vertical section area.

3. The light emitting device package according to claim 1, wherein the trench comprises a rectangular shape in section.

4. The light emitting device package according to claim 1, wherein the trench comprises a vertical width greater than a horizontal width thereof.

5. The light emitting device package according to claim 1, wherein the metal layer comprises a rectangular bar shape in a vertical section.

6. The light emitting device package according to claim 1, wherein the light emitting device comprises a horizontal-type light emitting device.

7. The light emitting device package according to claim 1, wherein the trench comprises a plurality of trenches disposed in a direction parallel to that of a (111) plane in a bottom surface of the package body.

8. The light emitting device package according to claim 1, wherein the light emitting device is attached to the adhesion layer.

9. The light emitting device package according to claim 1, wherein the package body further comprises a cavity and a reflection layer within the cavity.

10. The light emitting device package according to claim 9, wherein the reflection layer comprises conductivity.

11. A lighting system, comprising:
a light emitting module including a light emitting device package, the light emitting device package including
a package body having a trench,
a metal layer within the trench,
an adhesion layer over the metal layer,
a light emitting device over the adhesion layer,
a cathode lead in the package body on one side of the metal layer, and
an anode lead in the package body on another side of the metal layer,
wherein the trench comprises plural trenches extended in one direction in a top view,
wherein the metal layer is configured to release heat from the light emitting device,
wherein the metal layer is electrically separated from the cathode lead and the anode lead,
wherein at least one region of the adhesion layer is directly on at least one top surface region of the metal layer,
wherein the adhesion layer is a non-electrically conductive layer,
wherein the metal layer is electrically separated from the light emitting device by the adhesion layer,
wherein the package body comprises a silicon substrate having a <110> orientation, and
wherein the metal layer, the cathode lead and the anode lead are formed of a same electrically conductive metal material.

* * * * *